United States Patent
Cern

(10) Patent No.: US 8,093,745 B2
(45) Date of Patent: Jan. 10, 2012

(54) SENSING CURRENT FLOWING THROUGH A POWER LINE

(75) Inventor: Yehuda Cern, Efrat (IL)

(73) Assignee: Ambient Corporation, Newton, MA (US)

( * ) Notice: Subject to any disclaimer, the term of this patent is extended or adjusted under 35 U.S.C. 154(b) by 1585 days.

(21) Appl. No.: 11/482,275

(22) Filed: Jul. 7, 2006

(65) Prior Publication Data

US 2008/0007416 A1   Jan. 10, 2008

(51) Int. Cl.
*H02J 3/02* (2006.01)
*H02J 3/34* (2006.01)

(52) U.S. Cl. ....... 307/3; 340/538.16; 340/657; 340/664; 340/870.02; 307/104; 320/108

(58) Field of Classification Search .................. None
See application file for complete search history.

(56) References Cited

U.S. PATENT DOCUMENTS

| | | | |
|---|---|---|---|
| 3,909,618 A * | 9/1975 | Fujii et al. ........................ | 307/3 |
| 4,152,605 A * | 5/1979 | Conde et al. ..................... | 307/3 |
| 4,355,303 A * | 10/1982 | Phillips et al. .................... | 307/3 |
| 4,466,071 A * | 8/1984 | Russell, Jr. ....................... | 700/293 |
| 4,749,992 A * | 6/1988 | Fitzemeyer et al. ............ | 340/870.02 |
| 5,650,715 A | 7/1997 | Massie | |
| 5,691,627 A | 11/1997 | Shum | |
| 5,892,795 A * | 4/1999 | Paret ............................. | 375/222 |
| 6,262,672 B1 | 7/2001 | Brooksby et al. | |
| 6,438,144 B1 | 8/2002 | Guzikevits et al. | |
| 6,977,578 B2 * | 12/2005 | Kline ............................ | 370/501 |
| 7,061,370 B2 * | 6/2006 | Cern ............................. | 375/258 |
| 2002/0154000 A1 * | 10/2002 | Kline ............................ | 340/310.01 |
| 2002/0190719 A1 * | 12/2002 | Souder ........................... | 324/388 |
| 2003/0190110 A1 * | 10/2003 | Kline ............................ | 385/15 |
| 2005/0083206 A1 * | 4/2005 | Couch et al. ..................... | 340/657 |
| 2005/0169056 A1 * | 8/2005 | Berkman et al. ............... | 365/185.22 |
| 2005/0185349 A1 * | 8/2005 | Biester et al. ................... | 361/18 |
| 2006/0060007 A1 * | 3/2006 | Mekhanoshin et al. ....... | 73/865.9 |
| 2006/0227884 A1 * | 10/2006 | Koga et al. ..................... | 375/257 |
| 2007/0220570 A1 * | 9/2007 | Dawson et al. ................. | 725/111 |
| 2008/0106241 A1 * | 5/2008 | Deaver et al. .................. | 323/209 |
| 2009/0115427 A1 * | 5/2009 | Radtke et al. .................. | 324/629 |
| 2009/0121835 A1 * | 5/2009 | Borret et al. ................... | 340/10.1 |

OTHER PUBLICATIONS

JP Pub 2003-347976 to Kuniyoshi et al., english abstract, Dec. 5, 2003.*
JP Pub 2004-248118 to Sugano, english abstract, Sep. 2, 2004.*
WO Pub 02-093655 to Heskes, Nov. 21, 2002.*
International Search Report to the corresponding International Patent Application No. PCT/US2007/008895, dated Aug. 18, 2008.
Republic of China Office Action dated Apr. 12, 2011 corresponding to Application No. 200780025833.1.

* cited by examiner

*Primary Examiner* — Jared Fureman
*Assistant Examiner* — Justen Fauth
(74) *Attorney, Agent, or Firm* — Ohlandt, Greeley, Ruggiero & Perle, L.L.P.

(57) ABSTRACT

There is provided a method for measuring a parameter of a power frequency current being carried by a power line. The method that includes (a) transducing a power frequency current flowing through a power line, into a power frequency voltage, via an inductive coupler that couples a communications signal from the power line, (b) separating the power frequency voltage from the communications signal, and (c) determining a value of a parameter of the power frequency current from the power frequency voltage. There is also provided a system and an apparatus for measuring the parameter.

14 Claims, 10 Drawing Sheets

SENSING CURRENT FLOWING THROUGH A POWER LINE

BACKGROUND OF THE INVENTION

1. Field of the Invention

The invention generally relates to power line communications (PLC), and more particularly, to exploiting a power line inductive coupler for measuring power frequency current on a power line, and transmitting the measurement over a PLC network of which the same inductive coupler is a component.

2. Description of the Related Art

In a power line communication system, power frequency is typically in a range of 50-60 Hertz (Hz) and a data communications signal frequency is greater than about 1 MHz, and typically in a range of 1 MHz-50 MHz. A data coupler for power line communications couples the data communications signal between a power line and a communication device such as a modem.

An example of such a data coupler is an inductive coupler that includes a core, and a winding wound around a portion of the core. The core is fabricated of a magnetic material and includes an aperture. The inductive coupler operates as a transformer, and is situated on the power line such that the power line is routed through the aperture and serves as a primary winding of the transformer, and the winding of the inductive coupler serves as a secondary winding of the transformer. The data communications signal is coupled between the power line and the secondary winding via the core. The secondary winding is coupled, in turn, to the communication device.

One technique for measuring power frequency current in the power line is to employ a current transformer coupled to the power line, where the current transformer has a secondary short-circuited through an ammeter or other current sensing device. Alternatively, in a case of an open-circuited secondary, a primary current induces a secondary voltage proportional to the primary current.

SUMMARY OF THE INVENTION

There is provided a method for measuring a parameter of a power frequency current being carried by a power line. The method that includes (a) transducing a power frequency current flowing through a power line, into a power frequency voltage, via an inductive coupler that couples a communications signal from the power line, (b) separating the power frequency voltage from the communications signal, and (c) determining a value of a parameter of the power frequency current from the power frequency voltage. There is also provided a system and an apparatus for measuring the parameter.

DESCRIPTION OF THE INVENTION

Incidental to the high frequency operation of an inductive coupler, its secondary circuit output includes high frequency PLC signals and a power frequency current sense voltage, which may be separated and separately processed.

Figure 1A:
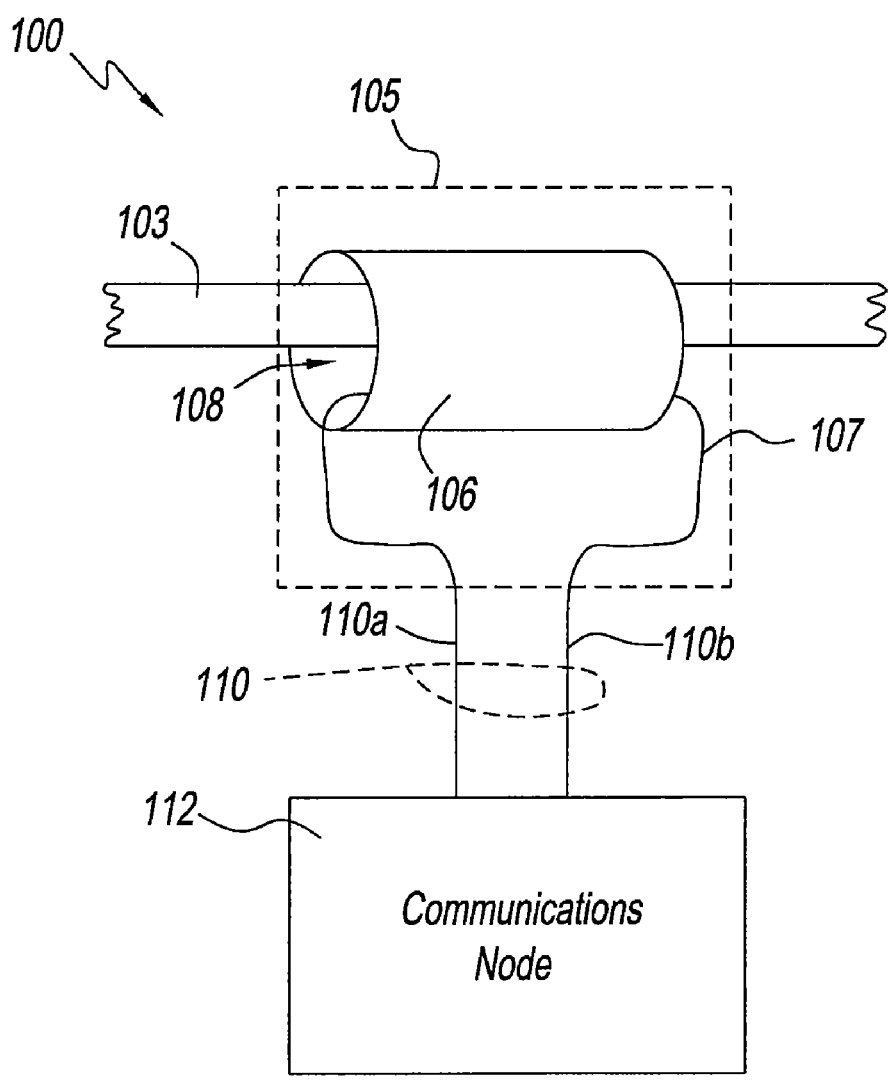
FIG. 1A is an illustration of a system configured for measuring current flowing through a power line.
Figure 1B:
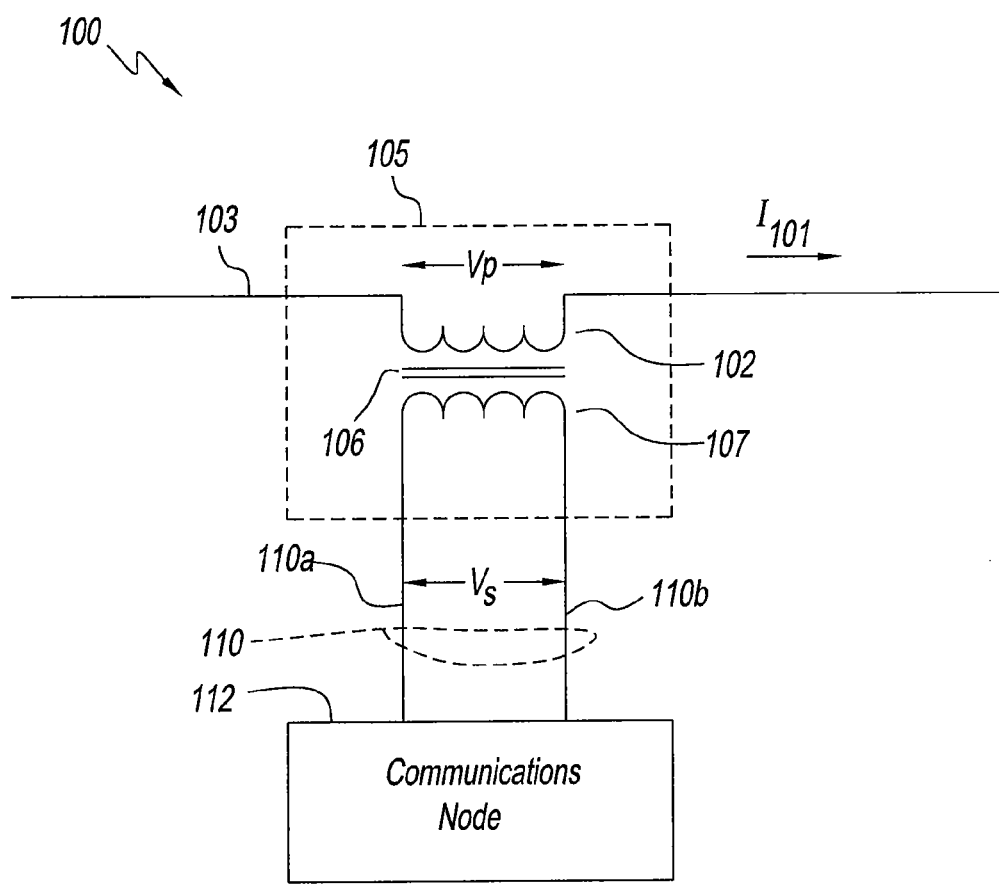
FIG. 1B is a schematic of the system of FIG. 1A.

FIG. 1A is an illustration, and FIG. 1B is a schematic, of a system 100 configured for measuring current flowing through a power line 103. System 100 includes an inductive coupler, i.e., coupler 105 and a communications node 112.

Coupler 105 includes a magnetic core, i.e., a core 106, having an aperture 108 therethrough. Coupler 105 operates as a current transformer, and is situated on power line 103 such that power line 103 is routed through aperture 108 and serves as a primary winding, represented schematically in FIG. 1B as a primary winding 102, for coupler 105. Coupler 105 also includes a secondary winding 107. Secondary winding 107 is coupled to communications node 112 via a pair of wires 110a and 110b, which are collectively designated as secondary winding pair 110.

Power line 103 carries (a) a power frequency current, e.g., a current of 200 amperes at a voltage of 13 kV and a frequency of 50-60 Hz, and (b) a PLC signal, also referred to herein as a data signal, e.g., a 10 volt peak-to-peak signal having a frequency in a range of 1 MHz to 50 MHz. Coupler 105 inductively couples signals between power line 103 and secondary winding pair 110 via core 106. More particularly, coupler 105 couples the PLC signals bi-directionally between power line 103 and secondary winding pair 110, and transduces the power frequency current signal from power line 103 into a power frequency voltage across secondary winding pair 110.

Power line 103 carries a power frequency current, i.e., $I_{101}$, having a frequency f. Primary winding 102 has an inductance Lp, and a reactance Xp, where $$Xp = 2\pi f Lp.$$

The reactance of power line 103 passing through core 106 is less than ten milliohms at power frequency. Lp is a low value because of multiple issues relating to operation at MHz frequencies. These include the relative permeability of high frequency magnetic cores being typically in the range of 100 to 1000, and the single turn primary represented by power line 103 passing only once through the aperture 108. For example, for f=60 Hz and Lp=3 μH, $$Xp = 2\pi f Lp = 1.13 \text{ milliohms}.$$

$I_{101}$ flows through primary winding 102, and according to Ohm's Law, a magnitude of a primary voltage drop Vp across primary winding 102 is given by $$Vp = Xp I_{101}.$$

A secondary voltage, i.e., a power frequency voltage, is induced across secondary winding 107. The secondary voltage, also termed current sense voltage Vs, is proportional to primary voltage drop Vp, and given by $$Vs = kVp,$$

where k is a coupling coefficient for coupler 105. Measuring Vs allows calculation of $$I_{101}=Vp/Xp=Vs/(k\,Xp).$$

Defining transadmittance as $$Y=1/(k\,Xp),$$

$I_{101}$ may be calculated as $$I_{101}=YVs.$$

A core magnetics' B-H curve starts as a straight line, from zero current up to some value, e.g. 200 amps, and then its slope starts to decrease, as it enters a region of increasing saturation. "Low current" refers to any current below that "knee." For low currents, Y is a constant. Core 106 begins to saturate above some value of $I_{101}$, and causes Y to decrease as $I_{101}$ increases. This dependence of Y on $I_{101}$, may be measured, and compensated for in the calculation $$I_{101}=YVs.$$

To illustrate the magnitudes involved, consider a power frequency f=60 Hz, and coupler 105 as having a primary inductance Lp=1 µH. Assume k=0.9. Then:

$$Xp=2\pi fLp$$

$$Xp=(2\pi)(60)(1\,\mu H)$$

$$Xp=377\text{ micro-ohms}$$

and $$Y=1/(k\,Xp)$$

$$Y=1/(0.9(377\text{ micro-ohms}))$$

$$Y=2950\text{ mhos}.$$

For $I_{101}$=200 amp power line current:

$$Vs=kXpI_{101}$$

$$Vs=0.9*377\text{ micro-ohms}*200\text{ amps}$$

$$Vs=68\text{ mV}.$$

For the present example, current measuring equipment would receive this 68 mV current sense voltage, multiply the current sense voltage by transadmittance Y=2950 mhos, and calculate a power line current of $I_{101}$=200 amps. Coupler 105, by way of its transadmittance, transduces the power line current into a current sense voltage.

Communications node 112 includes modules that sense the current sense voltage Vs. Communications node 112 also includes modules that calculate $I_{101}$, from the current sense voltage Vs, however as an alternative, communications node 112 may transmit data representing the current sense voltage Vs to another piece of equipment that will calculate $I_{101}$.

Figure 1C:
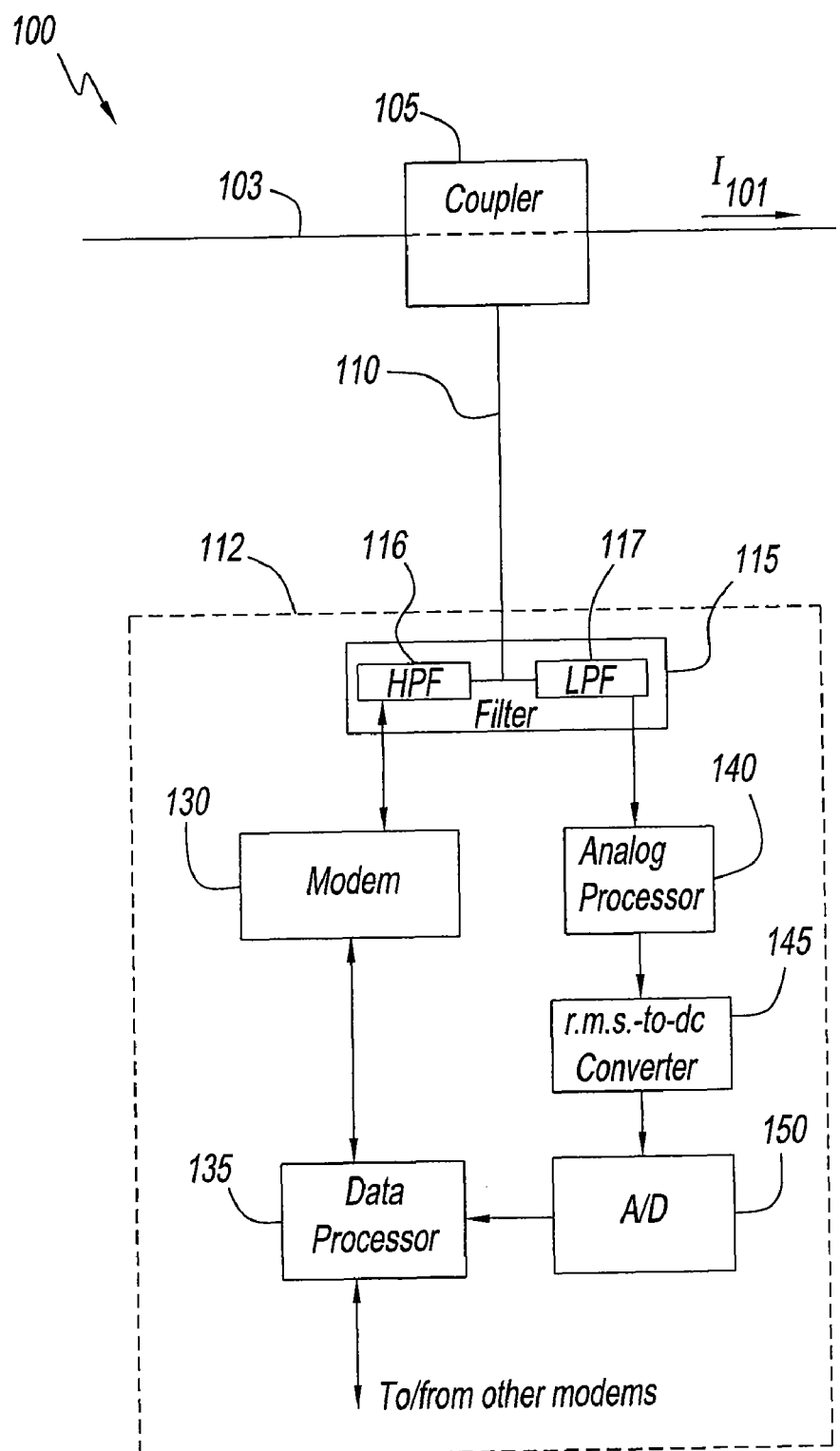
FIG. 1C is a block diagram of the system of FIG. 1A, and provides additional detail of the operation of a communications node.

FIG. 1C is a block diagram of system 100. Communications node 112 includes a filter module 115, a modem 130, a data processor 135, an analog processor 140, an r.m.s.-to-dc converter 145, and an analog-to-digital converter (A/D) 150.

Filter module 115 includes a high pass filter 116 and a low pass filter 117. High pass filter 116 passes PLC signals and blocks power frequency voltages. Low pass filter 117 passes power frequency voltages and blocks PLC signals. Low pass filter 117 outputs a filtered current sense voltage. The filtered current sense voltage is essentially the same as the current sense voltage Vs.

Modem 130 is coupled to filter module 115, and more particularly to high pass filter 116. Modem 130 is also coupled to data processor 135. Modem 130 conducts bi-directional communication of PLC signals with each of filter module 115 and data processor 135.

Analog processor 140 receives the filtered current sense voltage from low pass filter 117. Analog processor 140 preferably includes a transformer and/or amplifier (not shown), and scales the filtered current sense voltage. Analog processor 140 outputs a scaled current sense voltage.

r.m.s.-to-dc converter 145 receives the scaled current sense voltage from analog processor 140. The current sense voltage Vs is an approximately sinusoidal voltage. For the measurement of current, the parameter of interest is a root mean square, or an r.m.s. value, of the current. r.m.s.-to-dc converter 145 converts the scaled current sense voltage to a dc representation of the current sense voltage.

A/D 150 receives the dc representation of the current sense voltage from r.m.s.-to-dc converter 145, and converts it to a digital output, i.e., current sense data.

Data processor 135 receives the current sense data from A/D 150, and calculates $I_{101}$. Data processor 135 outputs data that represents a value for $I_{101}$.

Modem 130 receives the data from data processor 135, modulates the data onto a PLC signal, and transmits the PLC signal via filter module 115, coupler 105 and power line 103 to a remote monitoring site (not shown in FIG. 1C). Optionally, the current sense data and or the calculated value of $I_{101}$, may be output to a data port (not shown) or visual display (not shown) on communications node 112, to allow service personnel to monitor the line current on-site.

In review, in system 100, power line 103 carries a power frequency current. Coupler 105 is an inductive coupler that couples a communication signal from a power line 103, and transduces the power frequency current into a power frequency voltage. In communications node 112, filter module 115 separates the power frequency voltage from the communications signal, and processor 135 determines a value of a parameter of the power frequency current from the power frequency voltage.

Figure 2:
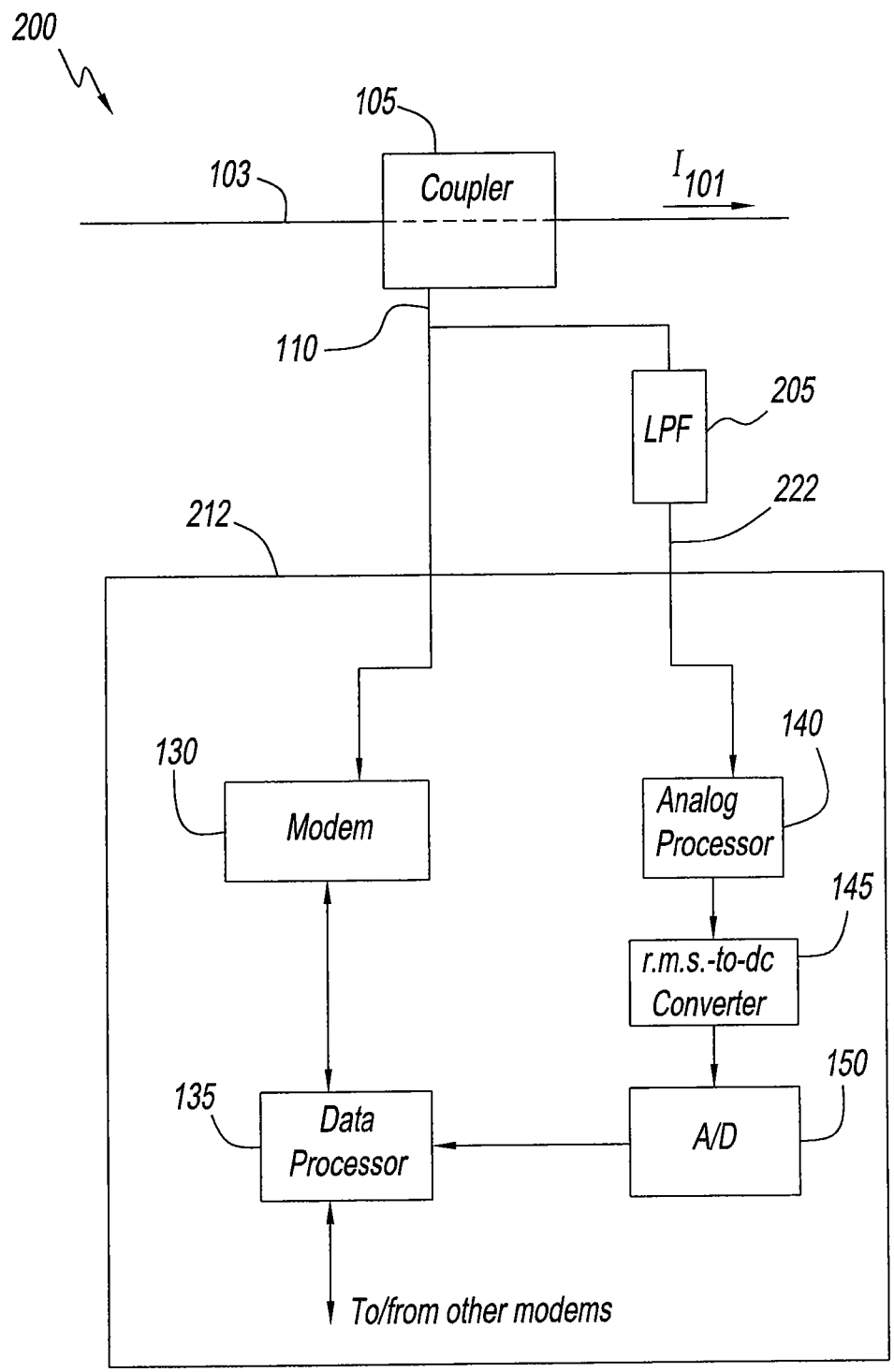
FIG. 2 is a block diagram of a system that employs separate cables for PLC signals and current sense voltage signals.

FIG. 2 is a block diagram of a system 200 that employs separate cables for PLC signals and current sense voltage signals. System 200 includes a low pass filter 205, and a communications node 212. Communications node 212 is similar to communications node 112, but does not include filter module 115. Secondary wire pair 110, from coupler 105, connects to modem 130 and low pass filter 205. A cable 222 connects low pass filter 205 to analog processor 140.

Low pass filter 205 passes power frequency voltages and blocks PLC signals. Low pass filter 205 receives current sense voltage Vs via secondary pair 110, and outputs a filtered current sense voltage to cable 222. Thus, low pass filter 205 separates the current sense voltage Vs from the PLC signals.

Analog processor 140 receives the filtered current sense voltage via cable 222, and, as in communications node 112, converts the filtered current sense voltage to a scaled current sense voltage.

Modem 130, data processor 135, r.m.s.-to-dc converter 145, and A/D 150 operate as in communications node 112.

Figure 3:
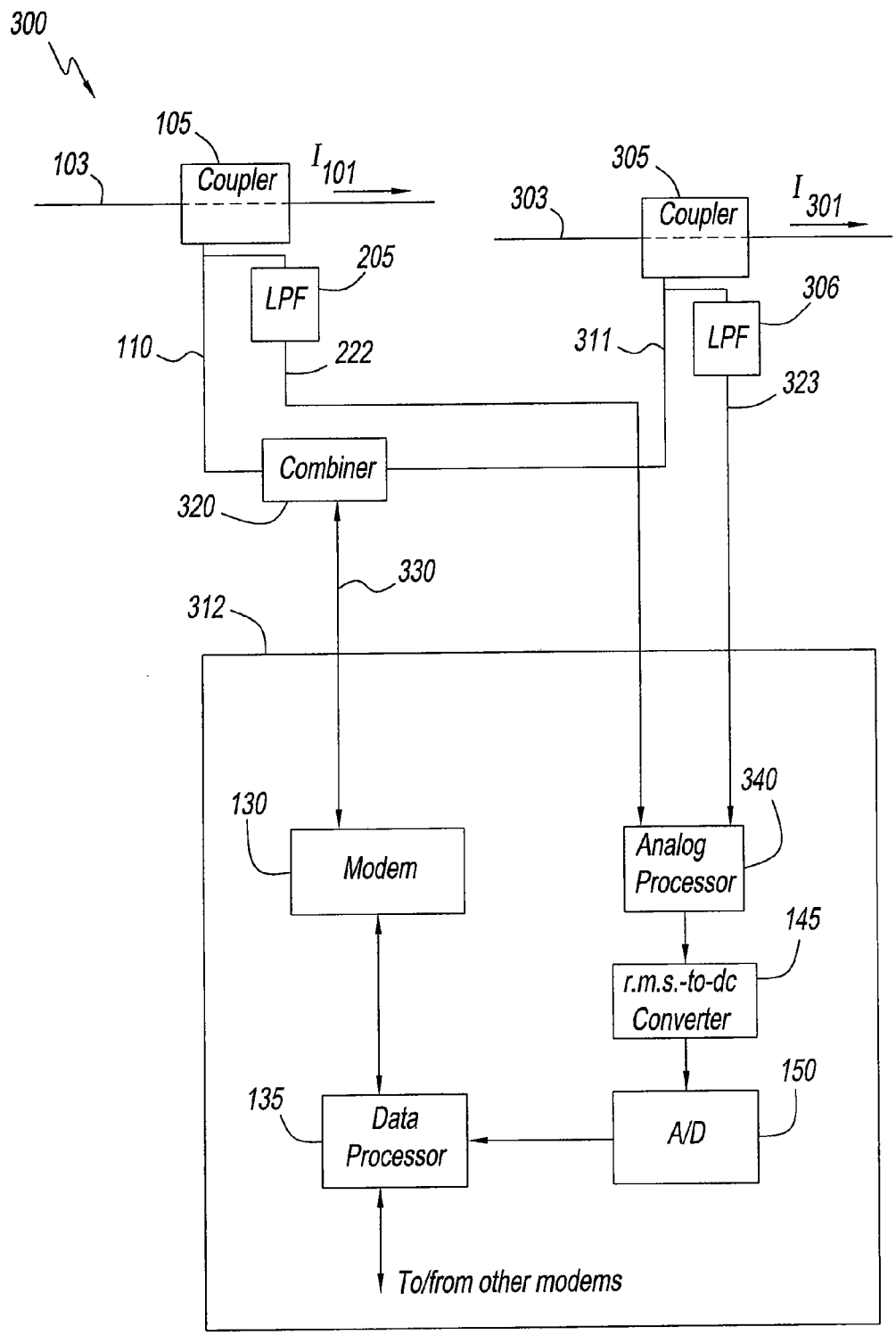
FIG. 3 is a block diagram of a system that senses a current in a first power line, and also sense a current in a second power line.

FIG. 3 is a block diagram of a system 300 that senses $I_{101}$ in power line 103, and also senses a current $I_{301}$ in a power line 303. System 300 includes coupler 105 on power line 103, and a coupler 305 on power line 303. System 300 also includes a signal combiner 320, a cable 330, a secondary wire pair 311, a low pass filter 306, a cable 323, and a communications node 312.

Coupler 105, as in system 100, (a) couples PLC signals between secondary winding pair 110 and power line 103, and (b) couples a power signal from power line 103, and induces a current sense voltage Vs, which is presented across secondary winding pair 110.

Coupler 305 couples PLC signals between secondary winding pair 311 and power line 303. Additionally, coupler 305 couples a power signal from power line 303, and induces a current sense voltage for power line 303 across a secondary winding (not shown) of coupler 305. The current sense voltage for power line 303 is presented across secondary winding pair 311.

Combiner 320 couples PLC signals between coupler 105 and communications node 312, and couples PLC signals between coupler 305 and communications node 312. When coupling PLC signals from couplers 105 and 305 to communications node 312, combiner 320 combines the PLC signals to yield a combined PLC signal, and outputs the combined PLC signal onto cable 330. When coupling PLC signals from communications node 312 to couplers 105 and/or 305, combiner 320 receives a combined PLC signal from communications node 312, and routes the PLC signals to couplers 105 and 305. The use of two couplers, i.e., couplers 105 and 305, is suitable, for example (a) to provide differential coupling onto two phases of the same three phase feeder, so as to cancel electromagnetic emissions, or (b) to couple onto two feeders going off in two directions.

Modem 130 is coupled to combiner 320, via cable 330, for bi-directional communication of PLC signals. Modem 130, data processor 135, r.m.s.-to-dc converter 145, and analog-to-digital converter 150 operate as in communications node 112.

Low pass filter 205 blocks PLC signals, and passes a current sense voltage from coupler 105. Low pass filter 205 outputs a filtered current sense voltage corresponding to $I_{101}$.

Low pass filter 306 blocks PLC signals, and passes a current sense voltage from coupler 305. Low pass filter 306 outputs a filtered current sense voltage corresponding to $I_{301}$.

Analog processor 340 receives the filtered current sense voltage corresponding to $I_{301}$ via cable 222, and receives the filtered current sense voltage corresponding to $I_{301}$ via cable 323. Analog processor 340 includes an analog multiplexer (not shown) as part of its input circuit, or another appropriate arrangement, for processing multiple input signals.

Figure 4:
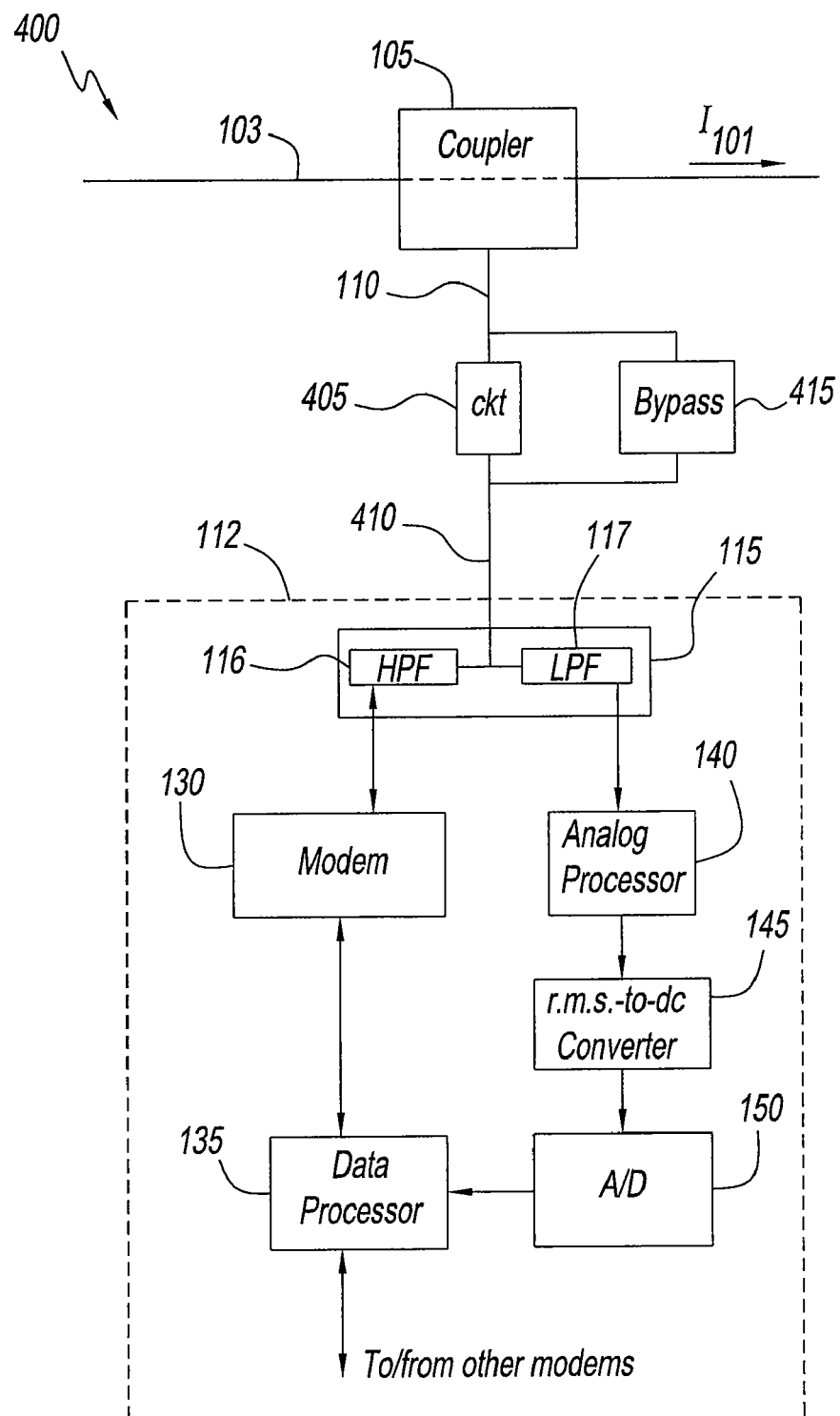
FIG. 4 is a block diagram of another system configured for measuring current flowing through a power line.

FIG. 4 is a block diagram of a system 400 that, similarly to system 100, includes a coupler 105 and a communications node 112. Communications node 112 operates in system 400 as it does in system 100. In contrast with system 100, system 400 includes a circuit 405, a bypass module 415, and a cable 410. Cable 410 connects each of circuit 405 and bypass module 415 to filter module 115.

Circuit 405 represents circuitry that operates in association with coupler 105, and passes PLC signals, but blocks power frequency signals. Examples of such circuitry include a surge suppressor and/or an impedance matching transformer.

Since circuit 405 blocks power frequency signals, bypass module 415 provides a path for power frequency signals from coupler 105 to communications node 112. More particularly, bypass module 415 routes the current sense voltage from coupler 105, around circuit 405, to cable 410. The PLC signals from circuit 405 and the current sense voltage are multiplexed onto cable 410, downstream of circuit 405. Bypass module 415 is effectively a low pass filter, and so does not appreciably affect the PLC signals at the inputs or outputs of circuit 405. Filter module 115 receives the multiplexed signal via cable 410, and by operations of high pass filter 116 and low pass filter 117, demultiplexes the PLC signals and the current sensing voltage.

Figure 5:
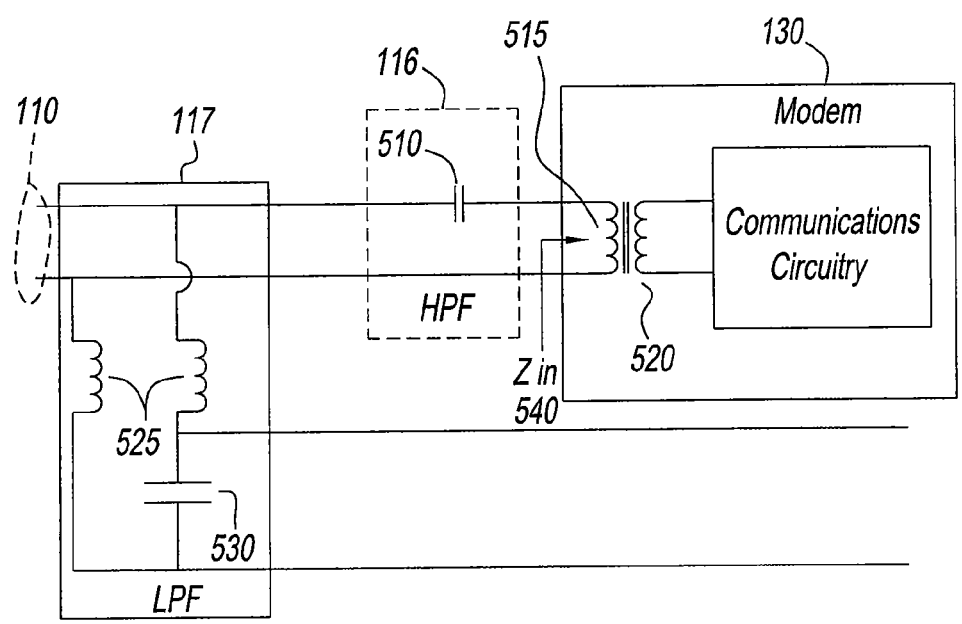
FIG. 5 is a schematic of a portion of a communications node, and shows an exemplary implementation of a high pass filter and a low pass filter.

FIG. 5 is a schematic of a portion of communications node 112 showing an exemplary implementation of high pass filter 116 and low pass filter 117.

Modem 130 includes a transformer 520 that, in turn, includes a primary winding 515. A secondary of transformer 520 is coupled to communications circuitry within modem 130.

High pass filter 116 includes a capacitor 510 that is situated in series with primary winding 515. Capacitor 510, primary 515 and modem input impedance Zin 540 function together as a high pass filter.

Low pass filter 117 includes chokes 525 and a capacitor 530. Chokes 525 conduct the current sense voltage signal (i.e., a low frequency signal), and block PLC signals. Capacitor 530 filters out any residual high frequency component.

Figure 6:
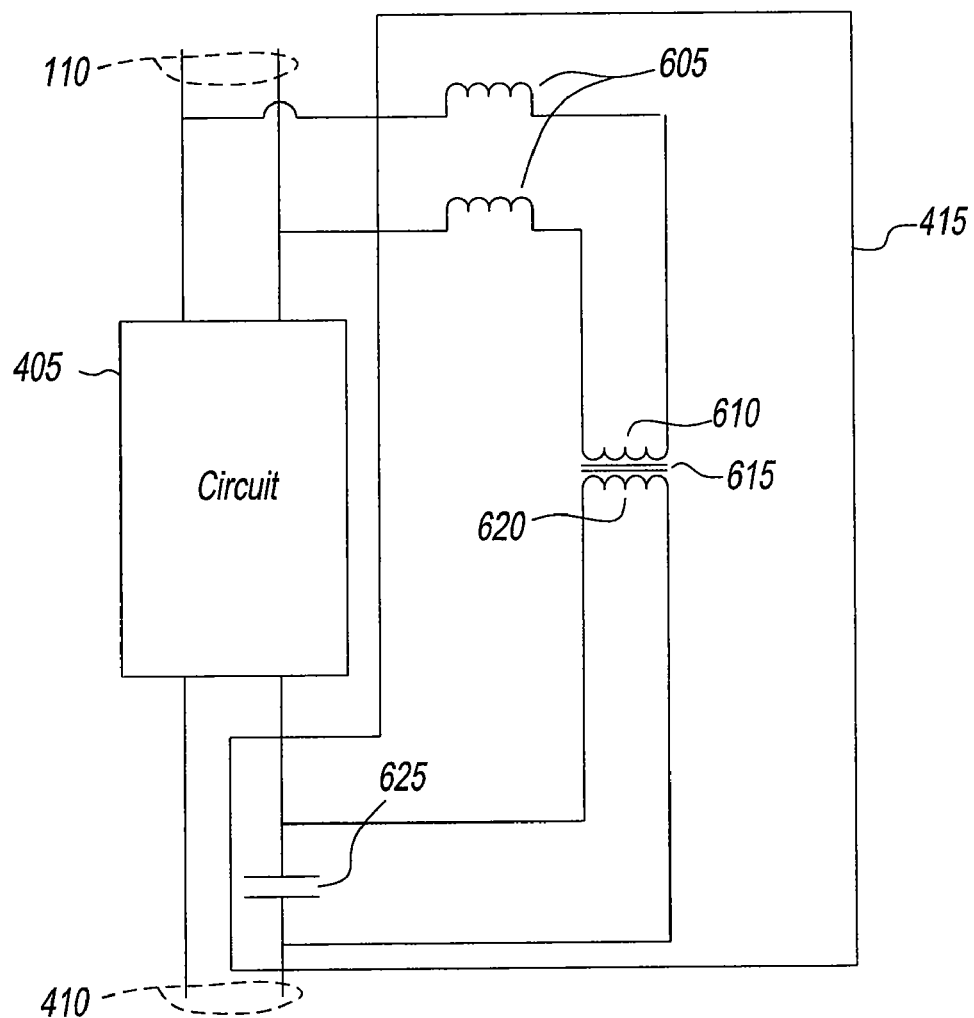
FIG. 6 is a schematic of a portion of the system of FIG. 4, and shows an exemplary implementation of a bypass module.

FIG. 6 is a schematic of a portion of system 400, and shows an exemplary implementation of bypass module 415. Here, bypass module 415 is shown to include chokes 605, a transformer 615, and a capacitor 625.

As mentioned above, circuit 405 passes PLC signals, but blocks power frequency signals. Chokes 605 provide a low impedance path for the current sense voltage signal (from secondary winding pair 110) to a primary 610 of transformer 615. Transformer 615 is a low frequency transformer, and may have a non-unity turns ratio so as to scale the magnitude of the current sense voltage to match an input voltage range of analog-to-digital converter 140 or r.m.s.-to-dc converter 145 (see FIG. 1C). A secondary 620 of transformer 615 is connected in series with a wire that conducts PLC signals at the output of circuit 405. This arrangement connects the PLC signals and current sense voltage in series, thus multiplexing the PLC signals and current sense voltage for multiplexed transmission via cable 410. Capacitor 625 has a value in the range of nanofarads, and acts as a short circuit to conduct the (high frequency) PLC signals, while appearing as an open circuit to the (low frequency) current sense voltage. Accordingly, for low frequencies, secondary 620 is placed in series with the output of circuit 405.

Figure 7:
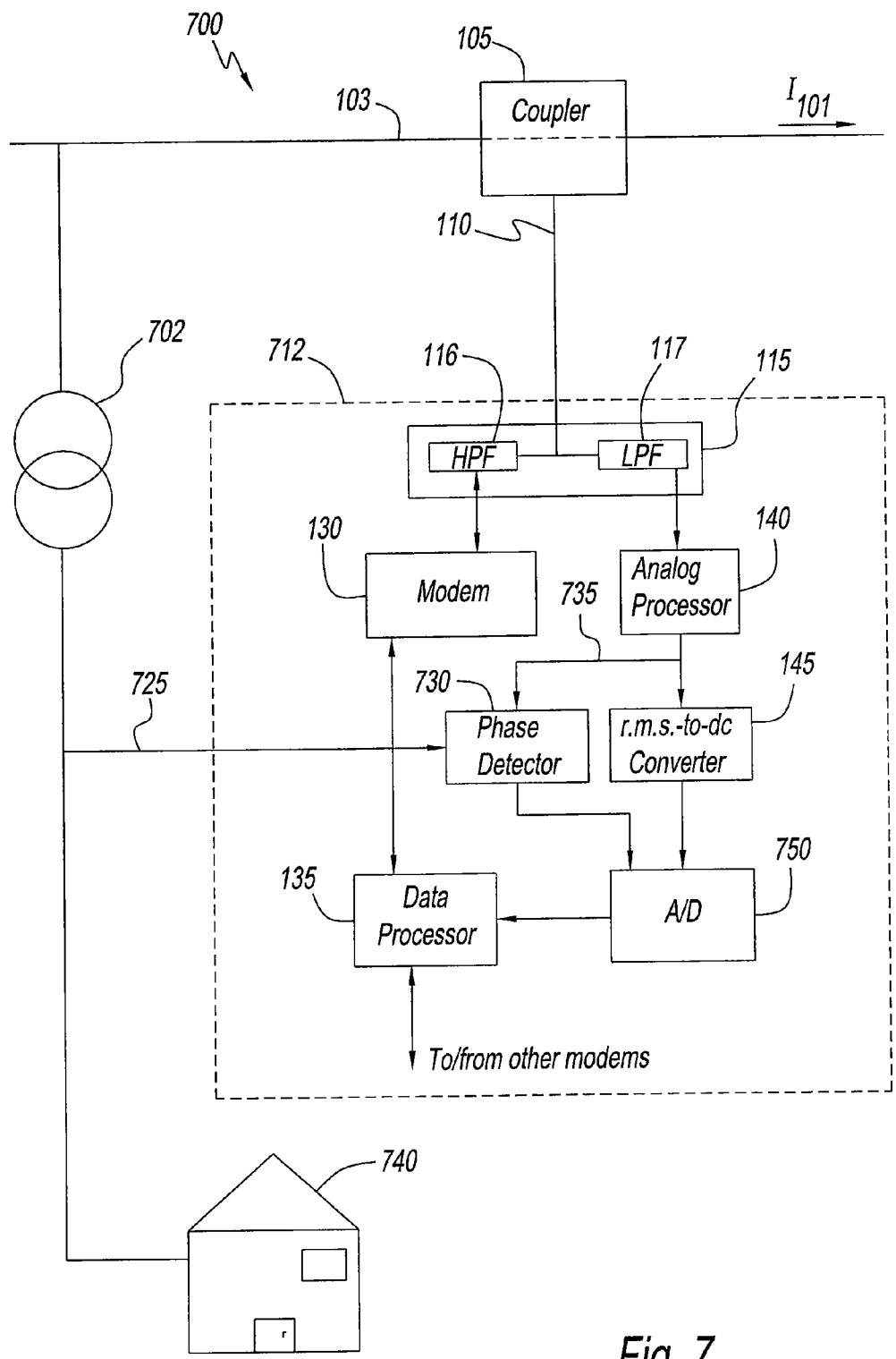
FIG. 7 is a block diagram of a system for measuring phase of a current of a medium voltage power line, referenced to a phase of a power voltage.

FIG. 7 is a block diagram of a system 700 for measuring phase of a current of a medium voltage power line, referenced to a phase of a power voltage. System 700 includes coupler 105, a distribution transformer 702, and a communications node 712.

Distribution transformer 702 transforms voltage from power line 103 to a lower voltage, and provides power to loads in a premises 740. Additionally, distribution transformer 702 provides power to communications node 712 via a low voltage power line 725.

Communications node 712 includes filter module 115, modem 130, analog processor 140, r.m.s.-to-dc converter 145, and data processor 135, all of which operate as described above. Communications node 712 further includes, a phase detector 730, and an analog-to-digital converter 750.

Phase detector 730 determines the phase of $I_{101}$, relative to a reference phase. More specifically, phase detector 730 receives a reference voltage derived from low voltage power line 725, and also receives an amplified current sense voltage from the output of analog processor 140. Phase detector 730 determines the phase of $I_{101}$, based on a phase relationship between the reference voltage derived from low voltage power line 725, and the amplified current sense voltage from the output of analog processor 140. Phase detector 730 outputs a voltage that represents the phase of $I_{101}$ relative to the phase of the reference voltage derived from low voltage power line 725.

Analog-to-digital converter 750 has two inputs, namely (a) an input from phase detector 730, i.e., the voltage that represents the phase of $I_{101}$, and (b) an input from r.m.s.-to-dc converter 145, i.e., the dc representation of the current sense voltage. Analog-to-digital converter 750 converts each of the two inputs to digital format, and outputs phase data and current sense data.

Data processor 235 receives the phase data and the current sense data from analog-to-digital converter 750, and sends the phase data and the current sense data to modem 130.

Modem 130 modulates the phase data and the current sense data onto PLC signal, and transmits the PLC signal via filter module 115, coupler 105 and power line 103, to other communications nodes (not shown in FIG. 7) connected by other couplers (not shown in FIG. 7) on a power line grid of which power line 103 is a part. In addition, this information may be presented on a display or at a data port (neither of which is shown) installed on or adjacent to communications node 712, for the benefit of personnel providing service at a site at which communications node 712 is located.

Figure 8:
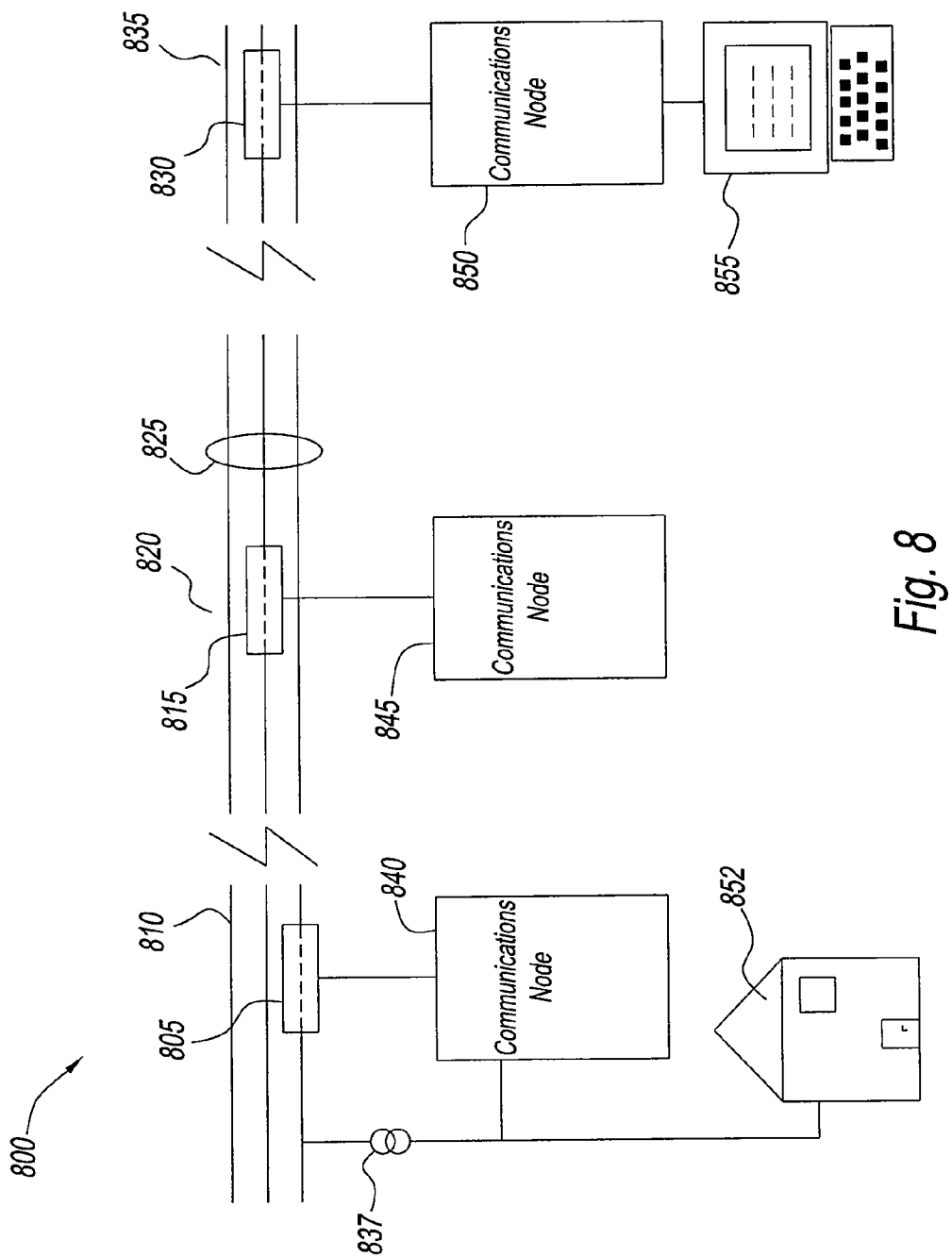
FIG. 8 is a block diagram of a portion of a power distribution network configured for measuring power parameters at various locations within the power distribution network.

FIG. 8 is a block diagram of a portion of a power distribution network 800 configured for measuring power parameters at various locations within power distribution network 800. Power distribution network 800 includes a three phase medium voltage power line, i.e., power line 825, couplers 805, 815 and 830, communications nodes 840, 845 and 850, and a monitor system 855.

Couplers 805, 815 and 830 are each similar to coupler 105. Communications nodes 840, 845 and 850 are each similar to communications node 712. Coupler 805 is situated at a location 810, and coupled to communications node 840. Coupler 815 is situated at a location 820, and coupled to communications node 845. Coupler 830 is situated at a location 835, and coupled to communications node 850. Monitor system 855 is also coupled to communications node 850.

A distribution transformer 837 transforms voltage from a phase line of power line 825 to a lower voltage, and provides power to loads in a premises 852. Additionally, distribution transformer 837 provides power to communications node 840. Communications nodes 845 and 850 are similarly powered by other distribution transformers (not shown).

Coupler 805 and communications node 840 operate together to sense current, phase and voltage at location 810. Communications node 840 periodically transmits the sensed values for location 810, in a PLC signal, via coupler 805, power line 825, coupler 830 and communications node 850 to monitor system 855.

Coupler 815 and communications node 845 operate together to sense current, phase and voltage at location 820. Communications node 845 periodically transmits the sensed values for location 820, in a PLC signal, via coupler 815, power line 825, coupler 830 and communications node 850 to monitor system 855.

Coupler 830 and communications node 850 operate together to sense current, phase and voltage at location 835. Communications node 850 periodically reports the sensed values for location 835 to monitor system 855.

Monitor system 855 is at a central control location, e.g. a substation. Monitor system 855 receives the sensed data for each of locations 810, 820 and 835, and develops a system-wide picture of currents and other electrical parameters throughout power distribution network 800. Monitor system 855 includes a display, analysis equipment, recording equipment and an alarm system that allows utility personnel to monitor operation of power distribution system 800, quickly locate and eliminate power outages when they occur, thus improving reliability and lowering the overall cost of grid maintenance of power distribution system 800.

Note that coupler 805 is attached to a lower phase line of power line 825, and that coupler 830 is attached to a middle phase line of power line 825. PLC signals couple from one phase to another, allowing communications relatively independent of the phase line on which a coupler is situated.

While sensing is described herein as sensing parameters on the phase lines to which couplers are attached, it is possible to attach self-contained conventional current sensors (not shown) to other phases, attach the digital outputs of the current sensors to ports (not shown) on communications nodes such as communications node 840, and provide monitor system 855 with a more complete set of data. Similarly, self-contained, conventional voltage sensors may be attached to low voltage or medium voltage power lines, and their digital data also supplied to monitor system 855. Accordingly, if a utility company needs a complete picture of all currents and voltages at some critical electric pole, the utility company can attach the types of sensors that the utility company typically uses to the other lines (otherwise unsensed by communications nodes 840, 845 and 850), and a conveniently situated communications node 840, 845 or 850 can serve as a digital data relay for these extra data sources.

Although the several systems described herein are described as providing bi-direction data communications in conjunction with the sensing of power line parameters, such need not be the case. For example, referring to FIG. 1, in system 100, there may not be a PLC signal present on power line 103 at a time when communications node 112 is measuring $I_{101}$. Thus, at the time of the measurement of $I_{101}$, the signal being coupled from power line 103, via coupler 105, may include only the power frequency signal, and no PLC signal. Moreover, regardless of whether a PLC signal is present on power line 103, communications node 112 need not be configured for bi-directional communication, but instead, may be configured only for PLC transmission via coupler 105. As such, communications node 112 would sense the power frequency signal, and thereafter transmit data representing the sensed signal, in a PLC signal, via coupler 105, to a remote monitoring station. Furthermore, communications node 112 need not be configured for any PLC via coupler 105. For example, communications node 112 may sense, process and present a result via an interface local to communications node 112, without necessarily transmitting any data to any other device.

A system for measuring magnitude and/or phase of a current on a medium voltage power line or a high voltage power line, and communicating the measurement, preferably isolates the lethal voltages from the measuring circuit and provides protection against surges that routinely occur on such lines. The systems described herein include an inductive coupler that can provide both current measurement and communications, so the measured data is easily concentrated at a central point, for analysis, alarm, recording and fault detection.

Although various exemplary embodiments of the invention have been disclosed, it should be apparent to those skilled in the art that various changes and modifications can be made that will achieve some of the advantages of the invention without departing from the true scope of the invention. For example, although high pass filter 116, low pass filter 117 and bypass module 415 are described herein as being implemented with discrete components (i.e., discrete capacitors and discrete inductors), they may be implemented as digital circuits in which their respective operations are preformed by digital signal processing. The present invention is intended to embrace all such changes and modifications that fall within the scope of the appended claims.

What is claimed is:

1. A method comprising:
   transducing a power frequency current flowing through a power line, into a power frequency voltage, via an inductive coupler that couples a communications signal from said power line;
   separating said power frequency voltage from said communications signal;
   determining a value of a parameter of said power frequency current from said power frequency voltage;
   modulating said value onto a resultant communication signal; and
   coupling said resultant communication signal to said power line, via said inductive coupler.

2. The method of claim 1, wherein said inductive coupler includes:
   (a) a magnetic core having an aperture therethrough, wherein said power line is routed through said aperture and serves as a primary winding for said inductive coupler; and
   (b) a secondary winding wound around a portion of said magnetic core, wherein said power frequency voltage is induced across said secondary winding.

3. The method of claim 1, wherein said separating comprises passing said power frequency voltage through a filter that blocks said communications signal.

4. The method of claim 3,
   wherein said communications signal is routed to a circuit that passes said communications signal and blocks said power frequency voltage, and
   wherein said method further comprises:
      routing said power frequency voltage around said circuit;
      multiplexing said power frequency voltage and said communications signal together, downstream of said circuit, to yield a multiplexed signal; and
      demultiplexing said multiplexed signal, prior to said determining.

5. The method of claim 1, wherein said power frequency voltage has a frequency in a range of about 50-60 Hz, and said communications signal has a frequency of greater than about 1 MHz.

6. The method of claim 1, wherein said parameter is selected from the group consisting of (a) a magnitude of said power frequency current, and (b) a phase of said power frequency current, with respect to a reference phase.

7. The method of claim 1,
   wherein said inductive coupler includes
   (a) a magnetic core having an aperture therethrough, wherein said power line is routed through said aperture and serves as a primary winding for said inductive coupler; and
   (b) a secondary winding wound around a portion of said magnetic core, wherein said coupled signal is induced across said secondary winding, and
   wherein said separating comprises passing said power frequency voltage through a filter that blocks said communications signal.

8. A system comprising:
   an inductive coupler that (a) couples a communications signal from a power line, and (b) transduces a power frequency current flowing through said power line, into a power frequency voltage;
   a filter that separates said power frequency voltage from said communications signal;
   a processor that determines a value of a parameter of said power frequency current from said power frequency voltage; and
   a modulator that modulates said value onto a resultant communications signal,
   wherein said system couples said resultant communications signal to said power line, via said inductive coupler.

9. The system of claim 8,
   wherein said inductive coupler includes:
   (a) a magnetic core having an aperture therethrough, wherein said power line is routed through said aperture and serves as a primary winding for said inductive coupler; and
   (b) a secondary winding wound around a portion of said magnetic core, wherein said value of a parameter of said power frequency current from said power frequency voltage is induced across said secondary winding.

10. The system of claim 8, wherein said filter passes said power frequency voltage and blocks said communications signal.

11. The system of claim 10,
   wherein said communications signal is routed to a circuit that passes said communications signal and blocks said power frequency voltage, and
   wherein said system further comprises:
      a bypass module that routes said power frequency voltage around said circuit;
      an arrangement that multiplexes said power frequency voltage and said communications signal together, downstream of said circuit, to yield a multiplexed signal; and
      an arrangement that demultiplexes said multiplexed signal so that said processor can determine said value.

12. The system of claim 8, wherein said power frequency voltage has a frequency in a range of about 50-60 Hz, and said communications signal has a frequency of greater than about 1 MHz.

13. The system of claim 8, wherein said parameter is selected from the group consisting of (a) a magnitude of said power frequency current, and (b) a phase of said power frequency current, with respect to a reference phase.

14. The system of claim 8,
   wherein said inductive coupler includes
   (a) a magnetic core having an aperture therethrough, wherein said power line is routed through said aperture and serves as a primary winding for said inductive coupler; and
   (b) a secondary winding wound around a portion of said magnetic core, wherein said coupled signal is induced across said secondary winding, and
   wherein said filter passes said power frequency voltage and blocks said communications signal.

* * * * *